(12) United States Patent
Ryu

(10) Patent No.: US 6,737,349 B2
(45) Date of Patent: May 18, 2004

(54) METHOD OF FORMING A COPPER WIRING IN A SEMICONDUCTOR DEVICE

(75) Inventor: Choon Kun Ryu, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/310,722

(22) Filed: Dec. 5, 2002

(65) Prior Publication Data

US 2003/0143843 A1 Jul. 31, 2003

(30) Foreign Application Priority Data

Dec. 29, 2001 (KR) ........................................ 2001-87983

(51) Int. Cl.$^7$ .......................................... H01L 21/4763
(52) U.S. Cl. ...................... 438/633; 438/639; 438/687; 438/695; 438/696; 438/723; 438/725; 438/736
(58) Field of Search ............................... 438/623–624, 438/626, 631, 633, 637–639, 687, 692, 695–696, 700, 723–725, 736

(56) References Cited

U.S. PATENT DOCUMENTS

| | | | | |
|---|---|---|---|---|
| 5,562,801 A | * | 10/1996 | Nulty | 438/695 |
| 6,436,825 B1 | * | 8/2002 | Shue | 438/687 |
| 6,465,159 B1 | * | 10/2002 | Ni et al. | 438/695 |
| 6,475,904 B2 | * | 11/2002 | Okoroanyanwu et al. | 438/637 |
| 6,528,884 B1 | * | 3/2003 | Lopatin et al. | 438/687 |
| 2002/0173142 A1 | * | 11/2002 | Vanhaelemeersch et al. | 438/637 |

FOREIGN PATENT DOCUMENTS

JP 2003229482 A * 8/2003 .......... H01L/21/768

* cited by examiner

*Primary Examiner*—Lynne Gurley
(74) *Attorney, Agent, or Firm*—Marshall, Gerstein & Borun LLP

(57) ABSTRACT

A method of forming a copper wiring in a semiconductor device. The method can prevent an increase of a dielectric constant of a low dielectric constant film and making bad deposition of a copper anti-diffusion film, due to infiltration of an organic solvent, an etch gas, etc. into the low dielectric constant film exposed at the side of a damascene pattern during a wet cleaning process for removing polymer generating when a portion of the low dielectric constant film is etched to form the damascene pattern or during a photoresist pattern strip process. In order accomplish these purpose, a $CF_XH_Y$ polymer layer is changed to a SiCH film using $SiH_4$ plasma without removing the polymer layer formed at the side of the damascene pattern. Therefore, infiltration of an organic solvent or an etch gas can be prevented due to the SiCH film having a condensed film quality and a good mechanical strength. Also, the SiCH film serves as a copper anti-diffusion film and in structure, supports a porous low dielectric constant film having a weak mechanical strength.

12 Claims, 2 Drawing Sheets

METHOD OF FORMING A COPPER WIRING IN A SEMICONDUCTOR DEVICE

BACKGROUND

1. Technical Field

Methods of forming copper wirings in semiconductor devices are disclosed. More particularly, methods of forming copper wirings in semiconductor devices are disclosed, which can prevent an increase of a dielectric constant of a low dielectric constant film and poor deposition of a copper anti-diffusion film due to infiltration of an organic solvent, etch gas, etc. into the low dielectric constant film exposed at the side of a damascene pattern during a wet cleaning process for removing polymer generated when a portion of the low dielectric constant film is etched to form the damascene pattern or during a photoresist pattern strip process.

2. Description of the Related Art

Generally, as the semiconductor industry shifts to an ultra large-scale integration (ULSI) level, the geometry of the semiconductor device is narrowed to a sub-half-micron but the circuit density is increased in view of performance improvement and reliability. In order to meet these needs, a thin copper film has been used as an interconnection material useful for the integration circuit in forming a metal wiring in the semiconductor device, since copper has a higher melting point and higher resistance against the electro-migration (EM) than aluminum and can thus improve reliability of the devices.

Methods of burying copper that are currently available are a physical vapor deposition (PVD) method, a reflow method, a chemical vapor deposition (CVD) method, an electroplating method, an electroless-plating method, and the like. Among them, the electroplating method and the CVD method that have a relatively good copper burial characteristic are preferred.

Further, a damascene scheme, by which a via contact hole electrically connected to a lower layer and a trench in which a metal wiring is located are simultaneously formed, has been widely employed in a process of forming the copper wiring in the semiconductor device. At this time, a low dielectric constant film is used.

Today, in the damascene method of forming the copper wiring, the low dielectric constant film having a dielectric constant of below 2.5 in the semiconductor device has been basically used. An ultra low dielectric constant film has lots of apertures within the film. In the wet cleaning process for removing polymer generated due to the etch process of forming the damascene pattern or a process for removing a photoresist pattern, an organic solvent, an etch gas, etc. is infiltrated into the porous ultra low dielectric constant film exposed at the side of the damascene pattern. As a result, the apertures in the ultra low dielectric constant film are filled with the organic solvent having a high dielectric constant. The dielectric constant of the entire wiring structure is thus increased. Further, in a subsequent process of depositing a copper anti-diffusion film, the organic solvent evaporates from the ultra low dielectric constant film at the side of the damascene pattern. Therefore, the fineness and close adhesion properties of the copper anti-diffusion film are degraded.

SUMMARY OF THE DISCLOSURE

Methods of forming copper wirings in semiconductor devices are disclosed which are capable of improving the electrical characteristic and reliability of the copper wiring by preventing infiltration of organic solvent, etch gas, etc. into a porous low dielectric constant film.

A disclosed method of forming a copper wiring in a semiconductor device comprises providing a semiconductor substrate on which a lower metal wiring is formed, forming a low dielectric constant film on the entire structure including the lower metal wiring, forming a hard mask layer on the low dielectric constant film, forming a photoresist pattern on the hard mask layer and then etching a portion of the low dielectric constant film by means of an etch process using the photoresist pattern and hard mask layer as masks, thus forming a damascene pattern, whereby a polymer having the formula $CF_XH_Y$ is generated in the etch process of forming the damascene pattern and the polymer sticks to the side of the damascene pattern to form a polymer layer, changing the polymer layer to a SiCH film using $SiH_4$ plasma and then removing the photoresist pattern, and forming a copper layer on the entire structure including the low dielectric constant film surrounded by the hard mask layer and the SiCH film and then polishing the copper layer by means of a chemical mechanical polishing process to form a copper wiring.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

FIG. 1A through FIG. 1D are cross-sectional views of semiconductor devices for explaining a disclosed method of forming a copper wiring in a semiconductor device according to a preferred embodiment.

Figure 1A:
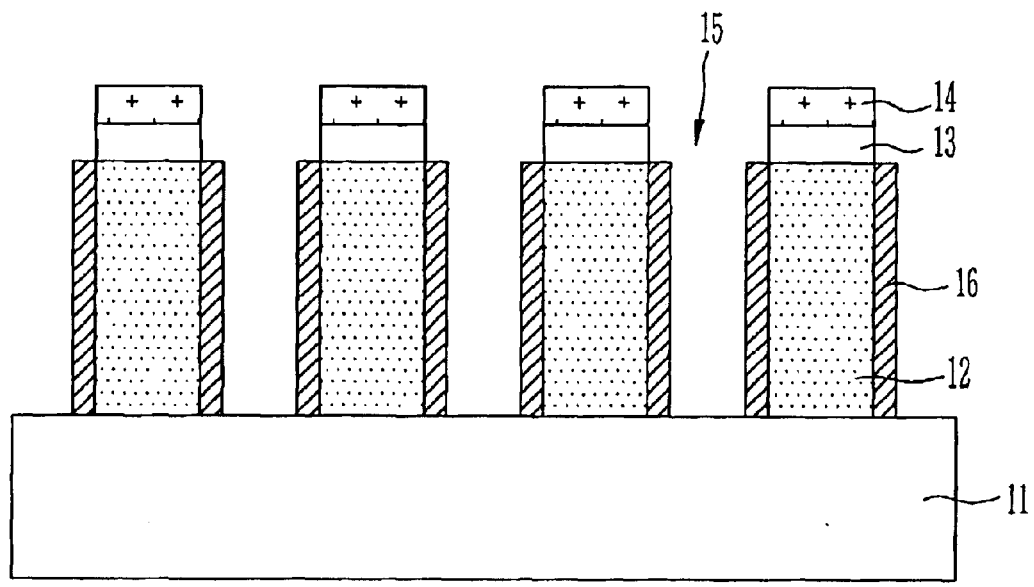
FIG. 1A through FIG. 1D are cross-sectional views of semiconductor devices for explaining a method of forming a copper wiring in a semiconductor device according to a preferred embodiment.

Referring now to FIG. 1A, a semiconductor substrate on which a lower metal wiring 11 is formed through a semiconductor device manufacture process is provided. A low dielectric constant film 12 is then formed on the entire structure including the lower metal wiring 11. Next, a hard mask layer 13 is formed on the low dielectric constant film 12 and a photoresist pattern 14 is then formed on the hard mask layer 13. A damascene pattern 15 having a via contact hole for electrically contacting the low dielectric constant film 12 and the lower metal wiring 11 and a trench located at the copper wiring is formed by an etch process of a damascene scheme using the photoresist pattern.

In the above, the low dielectric constant film 12 is made of a porous dielectric material having a dielectric constant of below 2.5. The porous dielectric material may include 'XLK' and 'BOSS' produced by 'Dow-Corning', 'Nano-glass' produced by 'Honeywell', 'LKD-T401' produced by 'JSR', 'Porogen' produced by 'IBM', 'Porous-SiLK' produced by 'Dow Chemical', and the like. Also, the hard mask layer 13 is made of an insulating material such as SiN, SiCH, $SiO_X$, or the like. At this time, the etch process of forming the damascene pattern 15 is performed in the reactive ion etch apparatus. Also, during the etch process, a polymer of a hydrocarbon component is generated during the etch process and the generated polymer then sticks to the side of the damascene pattern 15 having the via contact hole to form a polymer layer 16. The thickness and constituent of the polymer layer 16 can be freely controlled by varying the etch gas. At this time, the etch gas may include $CF_4$, $C_2F_6$, $C_3F_8$, $CHF_3$, $C_2HF_5$, $CF_2H_2$, or the like. The thickness and constituent of polymer can be also controlled by the ratio of a gas containing H and a CF series gas. The polymer in the layer 16 is primarily $CF_XH_Y$ (x and y is controlled by the amount and ratio of the gas, and $CF_X$ gas: the ratio of CHF gas is in range of 2:1 through 10:1). Therefore, the $CF_XH_Y$ polymer layer 16 of a desired thickness is easily obtained.

Figure 1B:
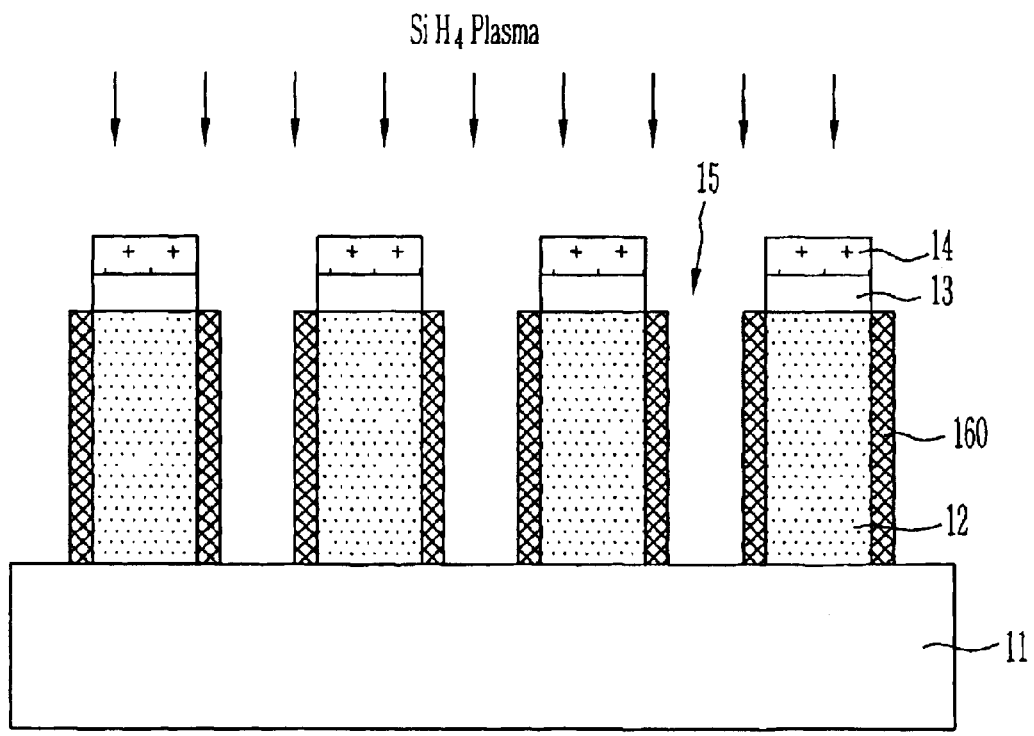

Referring now to FIG. 1B, the polymer layer 16 is changed to a SiCH film 160 by means of $SiH_4$ plasma, which reaction equation is as follows.
Equation (1)

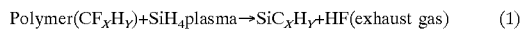

Polymer$(CF_XH_Y)$+$SiH_4$plasma→$SiC_XH_Y$+HF(exhaust gas)  (1)

In Equation (1), polymer made of a hydrocarbon component reacts to $SiH_4$ plasma. This reaction is then stopped when polymer is all changed to SiCH, and an exhaust gas such as HF is evaporated.

In the above, the constituent and strength of the SiCH film 160 can be controlled by changing the plasma power. In other words, if the plasma power is high, the amount of H contained within the SiCH film 160 is reduced to increase the mechanical strength and the dielectric constant. On the contrary, if the plasma power is low, the amount of H contained within the SiCH film 160 is increased to lower the mechanical strength and the dielectric constant. The thickness of the SiCH film 160 is determined by the thickness of the polymer layer 16. The SiCH film 160 has a condensed film quality and good mechanical strength. Further, the SiCH film 160 can prevent diffusion of infiltration metal ions such as an organic solvent, an etch gas, etc. into the low dielectric constant film 12 exposed at the side of the damascene pattern 15 in a subsequent wet cleaning process and a process for removing the photoresist pattern. Also, the SiCH film 160 serves as a copper anti-diffusion film to be formed in a subsequent process. The SiCH film 160 can support, in structure, the porous low dielectric constant film 12 having a weak mechanical strength.

Figure 1C:
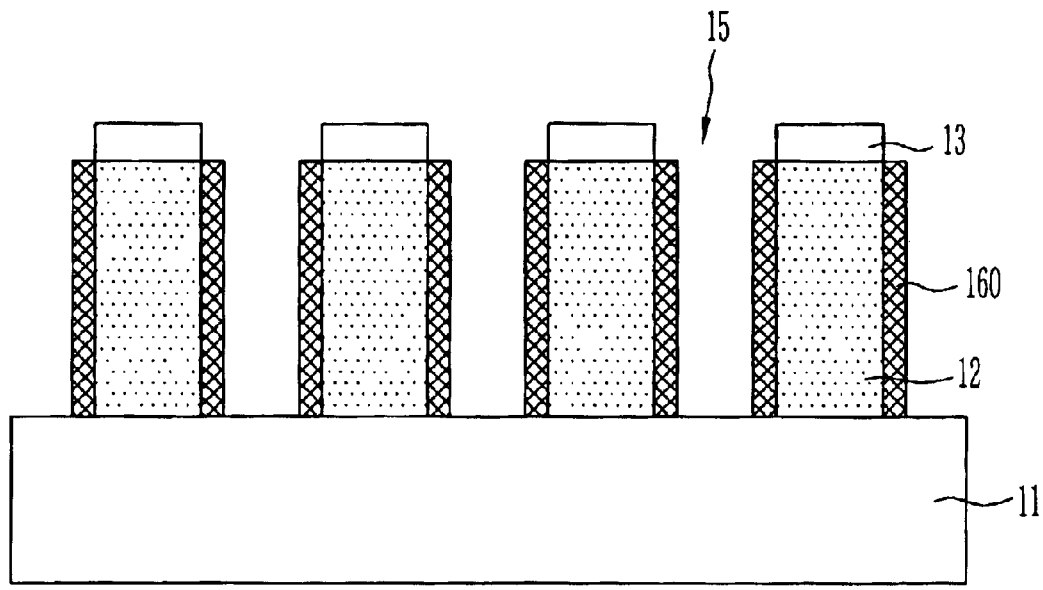

Referring now to FIG. 1C, the photoresist pattern 14 is removed. The low dielectric constant film 12 is thus surrounded by the hard mask layer 13 and the SiCH film 160, so that the low dielectric constant film 12 is sufficiently protected from diffusion of copper in the copper wiring to be formed in a subsequent process.

Figure 1D:
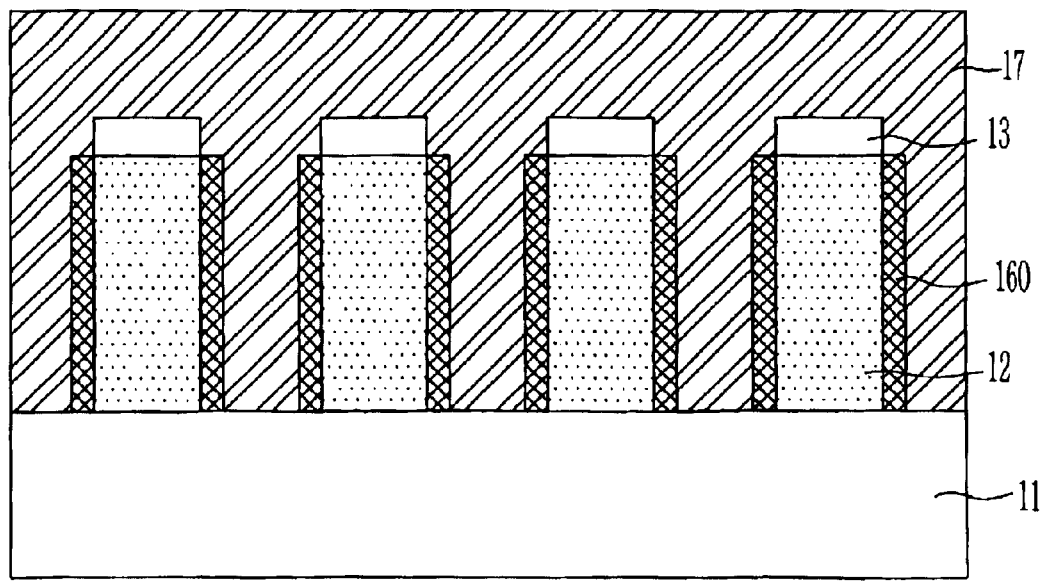

By reference to FIG. 1D, a copper layer is formed on the entire structure including the low dielectric constant film 12 surrounded by the hard mask layer 13 and the SiCH film 160. Thereafter, the copper layer is polished by means of a chemical mechanical polishing (CMP) process, thus forming an upper copper wiring 17.

In the above, the copper layer may be formed by means of a physical vapor deposition (PVD) method, a reflow method, a chemical vapor deposition (CVD) method, an electroplating method, an electroless-plating method, or the like.

Meanwhile, in order to efficiently prevent diffusion of copper in the copper wiring 17, the copper anti-diffusion film may be formed before the copper layer is formed. The copper anti-diffusion film may be formed by one of ionized PVD TiN, CVD TiN, MOCVD TiN, ionized PVD Ta, ionized PVD TaN, CVD Ta, CVD TaN and CVD WN.

As mentioned above, in order to prevent degradation of a low dielectric constant film, polymer of a hydrocarbon component generated in an etch process selectively reacts to $SiH_4$ plasma before a photoresist is stripped. Thus, a SiCH copper anti-diffusion film is formed at the side of a damascene pattern. Therefore, the disclosed method has an advantage that it can prevent infiltration of solvent in a subsequent wet cleaning process. Further, the disclosed method has another advantage that it can improve a structural strength of the entire wiring since a low dielectric constant film having a weak mechanical strength is supported by a strong mechanical strength of SiCH. In addition, the disclosed method has an advantage that it can supplement the side weakness of the copper anti-diffusion film using the copper anti-diffusion characteristic of SiCH.

The disclosed method has been described with reference to a particular embodiment in connection with a particular application. Those having ordinary skill in the art and access to the teachings of the disclosed method will recognize additional modifications and applications within the scope thereof.

It is therefore intended by the appended claims to cover any and all such applications, modifications, and embodiments within the spirit and scope of the present invention.

What is claimed is:

1. A method of forming a copper wiring in a semiconductor device comprising:

providing a semiconductor substrate on which a lower metal wiring is formed;

forming a low dielectric constant film on the substrate including the lower metal wiring;

forming a hard mask layer on the low dielectric constant film;

forming a photoresist pattern on the hard mask layer and then etching a portion of the low dielectric constant film by means of an etch process using the photoresist pattern as a mask, thus forming a damascene pattern, whereby a polymer defined by a formula $CF_XH_Y$ is generated in the etch process of forming the damascene pattern and said $CF_XH_Y$ polymer sticks to sides of the damascene pattern to form a $CF_XH_Y$ polymer layer thereon;

converting the $CF_XH_Y$ polymer layer to a SiCH film using a $SiH_4$ plasma and then removing the photoresist pattern; and forming a copper layer on the entire structure including the low dielectric constant film surrounded by the hard mask layer and the SiCH film and then polishing the copper layer by means of a chemical mechanical polishing process to form a copper wiring.

2. The method claimed in claim 1, wherein the low dielectric constant film is made of a porous dielectric constant material having a dielectric constant of about 2.5.

3. The method claimed in claim 1, wherein the hard mask layer is made of an insulating material selected from the group consisting of SiN, SiCH, $SiO_X$ and mixtures thereof.

4. The method claimed in claim 1, wherein the etch process of forming the damascene pattern uses a reactive ion etch apparatus.

5. The method claimed in claim 1, wherein the thickness and constituent of the polymer layer are controlled by changing an etch gas.

6. The method claimed in claim 1, wherein the constituent and strength of the SiCH film are controlled by changing a plasma power.

7. The method claimed in claim 1, wherein the thickness of the SiCH film is dependent on the thickness of the polymer layer.

8. The method claimed in claim 1, wherein the SiCH film serves as a copper anti-diffusion film.

9. The method claimed in claim 1, wherein the SiCH film serves to support, in structure, a porous low dielectric constant film having a weak mechanical strength.

10. The method claimed in claim 1, wherein the copper layer is formed by means of one of a physical vapor deposition method, a reflow method, a chemical vapor deposition method, an electroplating method and an electroless-plating method.

11. The method claimed in claim 1, further comprising the step of forming a copper anti-diffusion film before the copper layer is formed.

12. The method claimed in claim 11, wherein the copper anti-diffusion film is formed by a process selected from the group consisting of PVD TiN, CVD TiN, MOCVD TiN, ionized PVD Ta, ionized PVD TaN, CVD Ta, CVD TaN and CVD WN.

* * * * *